US012721229B2

(12) United States Patent
Lee

(10) Patent No.: US 12,721,229 B2
(45) Date of Patent: Aug. 25, 2026

(54) MEMORY AND SEMICONDUCTOR PACKAGE WITH PERIPHERAL CAPACITORS

(71) Applicant: SK hynix Inc., Gyeonggi-do (KR)

(72) Inventor: Dong Sop Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 388 days.

(21) Appl. No.: 18/465,168

(22) Filed: Sep. 12, 2023

(65) Prior Publication Data

US 2024/0355776 A1 Oct. 24, 2024

(30) Foreign Application Priority Data

Apr. 18, 2023 (KR) ........................ 10-2023-0050454

(51) Int. Cl.

*H10W 90/00* (2026.01)
*H05K 1/181* (2026.01)
*H10B 80/00* (2023.01)

(52) U.S. Cl.

CPC ............ *H10W 90/00* (2026.01); *H05K 1/181* (2013.01); *H10B 80/00* (2023.02); *H05K 2201/10159* (2013.01)

(58) Field of Classification Search

CPC ..... H01L 25/0652; H01L 25/18; H10B 80/00; H05K 1/181; H05K 2201/10159
USPC ........................................................... 257/723
See application file for complete search history.

(56) References Cited

U.S. PATENT DOCUMENTS

| | | | | |
|---|---|---|---|---|
| 2009/0065837 A1* | 3/2009 | Lee | ........................ | H10B 12/09 257/296 |
| 2024/0071921 A1* | 2/2024 | Chung | ................... | H10B 80/00 |

FOREIGN PATENT DOCUMENTS

| | | | |
|---|---|---|---|
| KR | 10-2011-0013701 A | 2/2011 | |
| KR | 10-1095724 B1 | 12/2011 | |
| KR | 10-2016-0148390 A | 12/2016 | |
| KR | 20180138242 A * | 12/2018 | ............. H01L 25/16 |

* cited by examiner

*Primary Examiner* — Phuc T Dang
(74) *Attorney, Agent, or Firm* — IP & T GROUP LLP

(57) ABSTRACT

In an embodiment of the present disclosure, since peripheral capacitors are disposed in an area other than an area where a plurality of memory cells of a memory are disposed, by using a method of forming cell capacitors disposed in the plurality of memory cells, the peripheral capacitors may be provided while improving the spatial efficiency of the memory. The peripheral capacitors of the memory may be provided as passive elements of a circuit positioned outside the memory, and thus, various semiconductor packages each including a memory may be easily implemented.

17 Claims, 10 Drawing Sheets

A1
A2
Ccell
UE1
LE1
d1
PD1
UE2
LE2
d2
UCP
LCP
Cout
I
I'
M1
M2
M3
M4
M5

A1
A2
Ccell
UE1
LE1
d1
PD2
UCP
LCP
Cout
UE2
LE2
d2
II
II'
M1
M2
M3
M4
M5

800
810
900
PMIC
1001
1002
Cout
Memory
Memory
Memory
Memory
Memory
Memory
Memory
Memory
100
100
100
100
100
100
100
100

MEMORY AND SEMICONDUCTOR PACKAGE WITH PERIPHERAL CAPACITORS

CROSS-REFERENCE TO RELATED APPLICATION

The present application claims priority under 35 U.S.C. § 119(a) to Korean Patent Application No. 10-2023-0050454 filed on Apr. 18, 2023, which is incorporated herein by reference in its entirety.

BACKGROUND

1. Technical Field

Various embodiments of the present disclosure relate to a memory and a semiconductor package.

2. Related Art

A memory includes a plurality of memory cells capable of storing data and a logic circuit for driving the plurality of memory cells.

The memory may be packaged together with a controller which controls the operation of the memory. Moreover, two or more memories may be packaged together. In this case, the memories packaged together may have the same type or different types.

A semiconductor package may further include, in addition to the memories and the controller, a circuit component such as a power circuit which supplies power to the memories and the controller.

As such, since various components such as the memory, the controller and the power supply circuit may be included in a semiconductor package, it is difficult to compactly implement the semiconductor package.

SUMMARY

Various embodiments are directed to providing measures capable of improving the efficiency of a memory and efficiently implementing a semiconductor package including the memory and various circuit components.

In an embodiment of the present disclosure, a semiconductor package may include: a memory including a first area in which a plurality of memory cells are disposed and a second area which is positioned outside the first area, wherein the memory includes cell capacitors disposed in the first area and at least two peripheral capacitors disposed in the second area; and a power control circuit positioned outside the memory, and configured to supply a voltage to the at least two peripheral capacitors.

In an embodiment of the present disclosure, a memory may include: a plurality of first capacitors included in a plurality of memory cells, and disposed in a first area; and a plurality of second capacitors positioned in a second area positioned outside the first area, and electrically connected to each other.

In an embodiment of the present disclosure, a semiconductor package may include: a printed circuit board (PCB); a memory mounted on the PCB; and a solution device mounted on the PCB, wherein the memory includes cell capacitors disposed in a core area and peripheral capacitors disposed in a peripheral circuit area, and wherein the peripheral capacitors are configured to be used for the solution device.

According to the embodiments of the present disclosure, the spatial efficiency of a memory may be improved, and a layout structure of a memory and various circuits included in a semiconductor package may be easily implemented.

DETAILED DESCRIPTION

Figure 1:
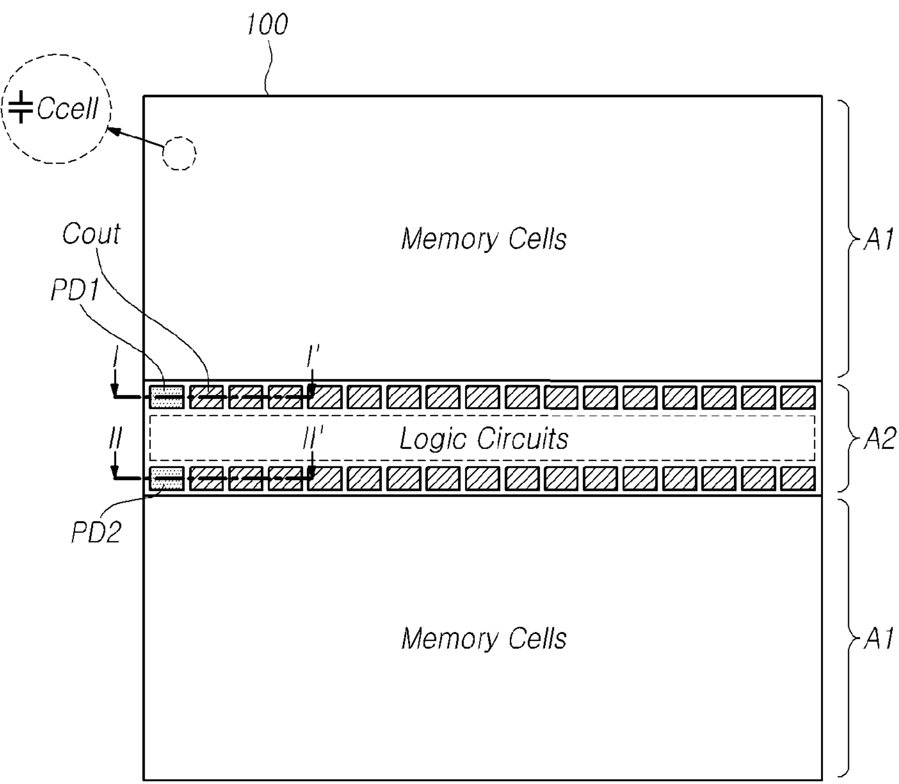
FIG. 1 is a diagram illustrating an example of a planar structure of a memory according to an embodiment of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as “including”, “having”, “containing”, “constituting” “made up of”, and “formed of” used herein are generally intended to allow other components to be added unless the terms are used with the term “only”. As used herein, singular forms are intended to include plural forms unless the context clearly indicates otherwise.

Terms, such as “first”, “second”, “A”, “B”, “(A)”, or “(B)” may be used herein to describe elements of the present disclosure. Each of these terms is not used to define essence, order, sequence, or number of elements etc., but is used merely to distinguish the corresponding element from other elements.

When it is mentioned that a first element “is connected or coupled to”, “contacts or overlaps” etc. a second element, it should be interpreted that, not only can the first element “be directly connected or coupled to” or “directly contact or overlap” the second element, but a third element can also be “interposed” between the first and second elements, or the first and second elements can “be connected or coupled to”, “contact or overlap”, etc. each other via a fourth element.

Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to accompanying drawings.

FIG. 1 is a diagram illustrating an example of a planar structure of a memory 100 according to an embodiment of the present disclosure.

Referring to FIG. 1, the memory 100 may include a first area A1 and a second area A2.

The first area A1 of the memory 100 may be a core area in which a plurality of memory cells are disposed. Each of the plurality of memory cells may include a cell capacitor Ccell. Each of the plurality of memory cells may further include at least one circuit element such as a transistor in addition to the cell capacitor Ccell. Each of the plurality of memory cells may store 1-bit data or 2 or more-bit data depending on a type.

The second area A2 of the memory 100 may be positioned outside the first area A1 of the memory 100. The second area A2 may be referred to as a peripheral circuit area.

The example illustrated in FIG. 1 shows a case where the second area A2 of the memory 100 is positioned between two divided first areas A1. The second area A2 of the memory 100 may be positioned on only one side of the first area A1 or on both sides of the first area A1. Alternatively, the second area A2 of the memory 100 may be positioned to surround the first area A1.

At least one logic circuit which drives the plurality of memory cells disposed in the first area A1 of the memory 100 may be disposed in the second area A2 of the memory 100.

The logic circuit may perform an operation of driving the plurality of memory cells and storing (programming or writing) data in each of the plurality of memory cells. Also, the logic circuit may perform an operation of reading data stored in the plurality of memory cells or erasing data stored in the plurality of memory cells.

The logic circuit may include at least one circuit element such as a transistor or a capacitor.

At least two external capacitors (i.e., peripheral capacitors) Cout may be disposed in a partial area of the second area A2 of the memory 100.

The external capacitors Cout may be disposed in an area other than an area where the logic circuit is disposed in the second area A2.

For example, the external capacitors Cout may be disposed on both sides of the area where the logic circuit is disposed in the second area A2. The external capacitors Cout may be disposed, in the second area A2, in an area between the plurality of memory cells disposed in the first area A1 and the logic circuit disposed in the second area A2.

A structure in which the external capacitors Cout are disposed is not limited to the above-described example, and a structure in which the external capacitors Cout are disposed using at least a partial area of the second area A2 positioned outside the first area A1 where the plurality of memory cells are disposed may be included in the embodiment of the present disclosure.

For example, each of the external capacitors Cout may be formed to have the same structure as the cell capacitor Ccell which is disposed in each of the plurality of memory cells. In this case, the external capacitors Cout may be disposed in the second area A2 through a process of forming the cell capacitors Ccell.

Each of the external capacitors Cout may be formed to have the same size as the cell capacitor Ccell. Alternatively, each of the external capacitors Cout may be formed to have a size larger than the cell capacitor Ccell.

At least some of the external capacitors Cout disposed in the second area A2 may be electrically connected to each other. For example, all of the external capacitors Cout may be electrically connected.

The external capacitors Cout which are physically separated may operate as one capacitor by being electrically connected to each other. Depending on a required capacitance, the external capacitors Cout may be disposed in a structure in which all or some of the external capacitors Cout are electrically connected to each other.

The memory 100 may include at least one pad electrode which is electrically connected to at least a part of the external capacitors Cout and is exposed to the outside.

For example, the memory 100 may include a first pad electrode PD1 and a second pad electrode PD2.

The first pad electrode PD1 and the second pad electrode PD2 may be disposed to be exposed to the outside. Each of the first pad electrode PD1 and the second pad electrode PD2 may be electrically connected to at least a part of the external capacitors Cout.

In the example illustrated in FIG. 1, when the external capacitors Cout are all electrically connected, the first pad electrode PD1 and the second pad electrode PD1 which are electrically connected to both electrodes, respectively, included in each of the external capacitors Cout may be disposed.

In the case of a structure in which the external capacitors Cout are divided into at least two groups and are electrically connected, a plurality of pairs of pad electrodes which are electrically connected to the external capacitors Cout of the respective groups may be disposed. For example, external capacitors Cout which are positioned at an upper side of the second area A2 illustrated in FIG. 1 may be electrically connected as one group, and two pad electrodes which are electrically connected to the corresponding external capacitors Cout may be disposed. External capacitors Cout which are positioned at a lower side of the second area A2 may be electrically connected as one group, and two pad electrodes which are electrically connected to the corresponding external capacitors Cout may be further disposed.

The external capacitors Cout which are electrically connected to each other may be electrically connected to a circuit which is positioned outside the memory 100, through the first pad electrode PD1 and the second pad electrode PD2.

The external capacitors Cout may be disposed in a state in which they are insulated from a circuit element disposed in the second area A2 and a circuit element disposed in the first area A1.

Since the external capacitors Cout are disposed in a partial area of the second area A2 where a circuit element is not disposed, outside the first area A1 where a plurality of cell capacitors Ccell are disposed, the spatial efficiency of the memory 100 may be improved.

Since the external capacitors Cout disposed in a partial area of the second area A2 of the memory 100 are provided as circuits which are positioned outside, the disposition of passive elements in a semiconductor package including the memory 100 and another circuit component may be reduced, and thus, the structure of the semiconductor package may be easily implemented.

As described above, the external capacitors Cout may be formed through the same process as the cell capacitor Ccell disposed in each of the plurality of memory cells. The external capacitors Cout may be disposed at the same layer as the cell capacitors Ccell, and may be formed using the same material.

Figure 2:
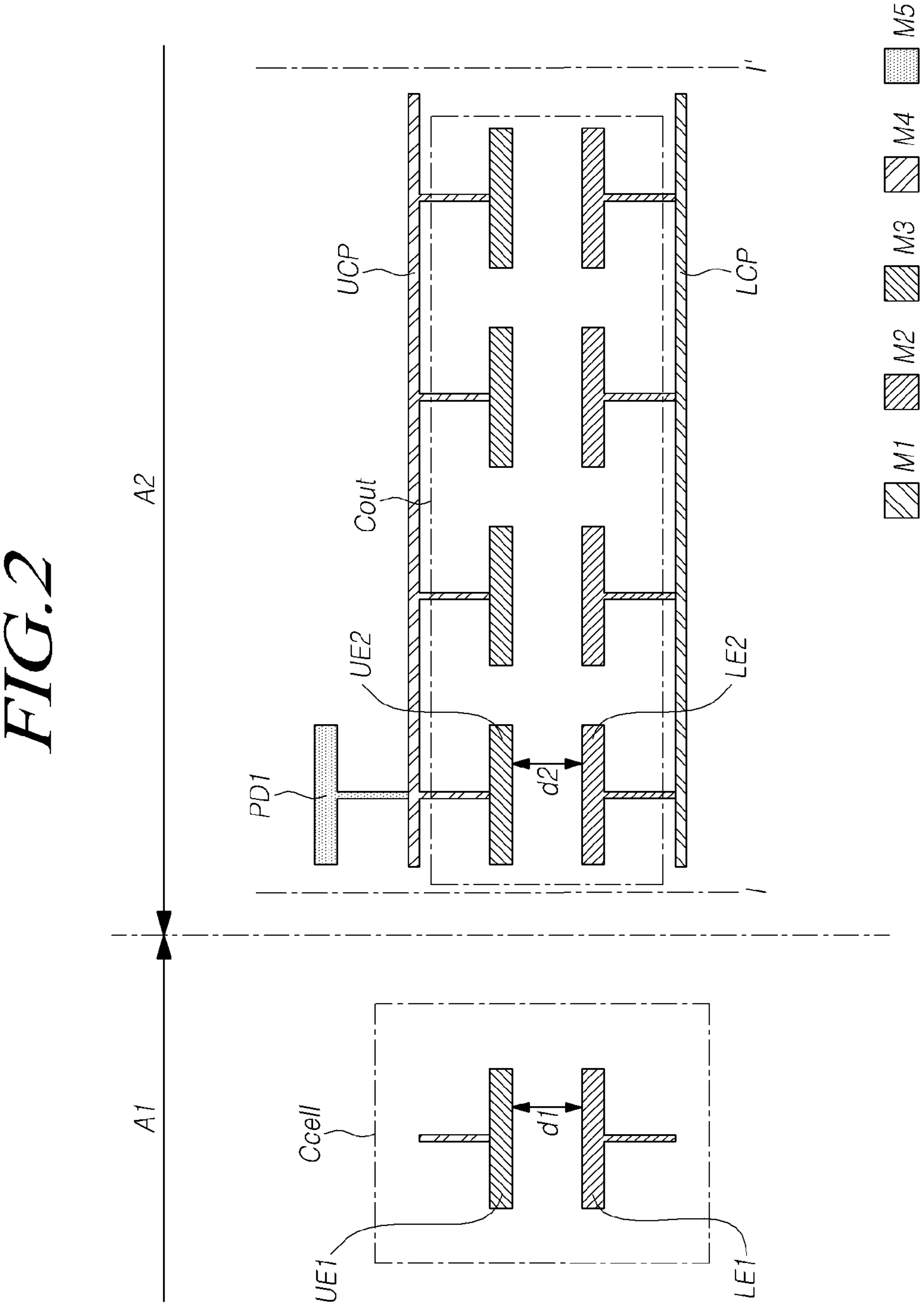
FIG. 2 is a diagram illustrating an example of a cross-sectional structure of a first area and a cross-sectional structure, taken along the line I-I' of FIG. 1, of a second area in the memory illustrated in FIG. 1.
Figure 3:
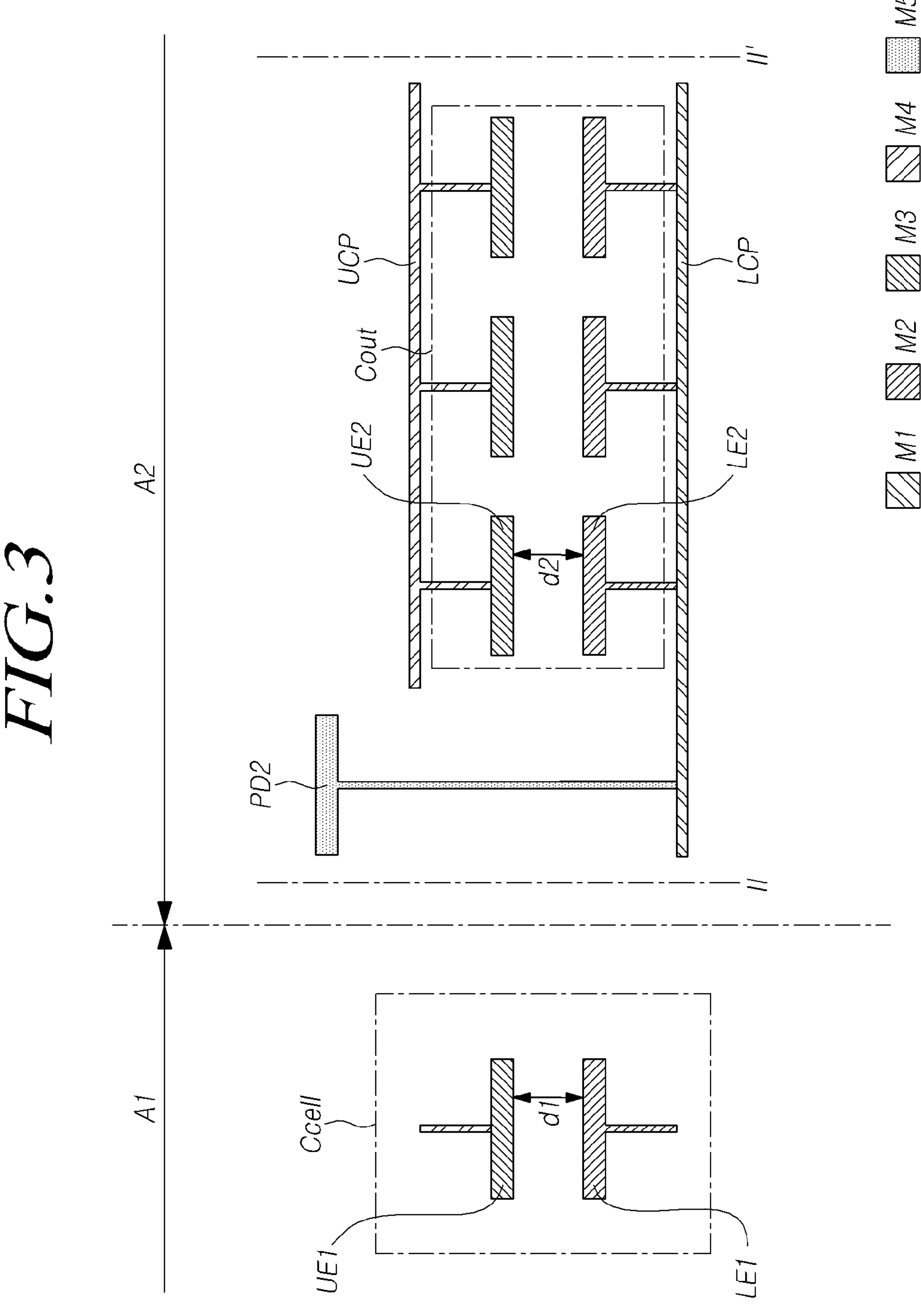
FIG. 3 is a diagram illustrating an example of a cross-sectional structure of the first area and a cross-sectional structure, taken along the line II-II' of FIG. 1, of the second area in the memory illustrated in FIG. 1.

FIG. 2 is a diagram illustrating an example of a cross-sectional structure of the first area A1 and a cross-sectional structure, taken along the line I-I' of FIG. 1, of the second area A2 in the memory 100 illustrated in FIG. 1. FIG. 3 is a diagram illustrating an example of a cross-sectional structure of the first area A1 and a cross-sectional structure, taken along the line II-II' of FIG. 1, of the second area A2 in the memory 100 illustrated in FIG. 1.

For the sake of convenience in description, FIGS. 2 and 3 illustrate only structures in which electrodes are disposed, and an insulating layer may be positioned between the electrodes.

Referring to FIGS. 2 and 3, the cell capacitor Ccell may be disposed in each of the plurality of memory cells in the first area A1. The cell capacitor Ccell may include a first upper electrode UE1 and a first lower electrode LE1. The distance between the first upper electrode UE1 and the first lower electrode LE1 may be d1.

The external capacitors Cout may be disposed in a partial area of an area where a logic circuit is not disposed in the second area A2.

Each of the external capacitors Cout may include a second upper electrode UE2 and a second lower electrode LE2. The distance between the second upper electrode UE2 and the second lower electrode LE2 may be d2.

At least one of the second upper electrode UE2 and the second lower electrode LE2 may be disposed at the same layer as at least one of the first upper electrode UE1 and the first lower electrode LE1.

For example, the second upper electrode UE2 may be disposed at the same layer as a layer where the first upper electrode UE1 is disposed. The second lower electrode LE2 may be disposed at the same layer as a layer where the first lower electrode LE1 is disposed.

The distance d2 between the second upper electrode UE2 and the second lower electrode LE2 may be the same as the distance d1 between the first upper electrode UE1 and the first lower electrode LE1.

Since the external capacitors Cout may be formed through the same process as the cell capacitors Ccell, the area of each of the second upper electrode UE2 and the second lower electrode LE2 of the external capacitors Cout may be the same as the area of each of the first upper electrode UE1 and the first lower electrode LE1 of the cell capacitor Ccell.

The area of the second upper electrode UE2 may be larger than the area of the first upper electrode UE1. The area of the second lower electrode LE2 may be larger than the area of the first lower electrode LE1.

The external capacitors Cout may be electrically connected to each other. At least a part of the external capacitors Cout may be electrically connected to pad electrodes.

Second upper electrodes UE2 included in the external capacitors Cout, respectively, may be electrically connected to each other. Second lower electrodes LE2 included in the external capacitors Cout, respectively, may be electrically connected to each other.

For example, the second upper electrodes UE2 included in the external capacitors Cout, respectively, may be electrically connected to each other by an upper connection pattern UCP. The second upper electrodes UE2 may be electrically connected to the first pad electrode PD1 through the upper connection pattern UCP.

The upper connection pattern UCP may be positioned between a layer where the second upper electrodes UE2 are disposed and a layer where the first pad electrode PD1 is disposed.

The second lower electrodes LE2 included in the external capacitors Cout, respectively, may be electrically connected to each other through a lower connection pattern LCP. The second lower electrodes LE2 may be electrically connected to the second pad electrode PD2 through the lower connection pattern LCP.

The second lower electrodes LE2 may be positioned between a layer where the lower connection pattern LCP is disposed and a layer where the second pad electrode PD2 is disposed.

The second pad electrode PD2 may be positioned at a layer where the first pad electrode PD1 is disposed.

As such, the structure of each external capacitor Cout, the connection structure between the external capacitors Cout and the connection structure between the external capacitor Cout and a pad electrode may be implemented using at least two metal layers.

For example, as illustrated in FIGS. 2 and 3, the lower connection pattern LCP may be disposed using a first metal layer M1. The second lower electrodes LE2 may be disposed using a second metal layer M2 over the first metal layer M1. An insulating layer may be positioned between the first metal layer M1 and the second metal layer M2.

The second upper electrodes UE2 may be disposed using a third metal layer M3 over the second metal layer M2. An insulating layer may be positioned between the second metal layer M2 and the third metal layer M3.

The first lower electrode LE1 and the first upper electrode UE1 of the cell capacitor Ccell may also be disposed using the second metal layer M2 and the third metal layer M3, respectively.

The upper connection pattern UCP may be disposed using a fourth metal layer M4 over the third metal layer M3. An insulating layer may be positioned between the third metal layer M3 and the fourth metal layer M4.

The first pad electrode PD1 and the second pad electrode PD2 may be disposed using a fifth metal layer M5 over the fourth metal layer M4. An insulating layer may be positioned between the fourth metal layer M4 and the fifth metal layer M5.

The first pad electrode PD1 and the second pad electrode PD2 may be exposed to the outside while being electrically connected to the upper connection pattern UCP and the lower connection pattern LCP, respectively. The external capacitors Cout may be electrically connected to an external circuit through the first pad electrode PD1 and the second pad electrode PD2.

Since the first pad electrode PD1 is electrically connected to the external capacitor Cout through the upper connection pattern UCP, the first pad electrode PD1 may be positioned in an area overlapping with the external capacitor Cout.

Since the second pad electrode PD2 is electrically connected to the external capacitor Cout through the lower connection pattern LCP, the second pad electrode PD2 may be positioned in an area not overlapping with the external capacitor Cout.

In this way, the structure of each external capacitor Cout, the connection structure between the external capacitors Cout and the connection structure between the external capacitor Cout and pad electrodes in the second area A2 may be implemented by using metal layers used to form the cell capacitor Ccell, etc. in the first area A1 or by adding some metal layers.

Since the external capacitors Cout may be formed through the process of the cell capacitor Ccell, addition of a process may not be required or the number of processes to be added may be minimized. Since the external capacitors Cout are disposed using an empty space of the second area A2, the spatial efficiency of the memory 100 may be increased without affecting the plurality of memory cells disposed in the first area A1.

In addition, since the external capacitors Cout formed by using a remaining area of the second area A2 of the memory 100 may be provided as a circuit positioned outside the memory 100, the structure of a semiconductor package including the memory 100 and a circuit component may be compactly implemented.

Also, the electrical connection structure between the external capacitors Cout may be implemented without adding a separate metal layer.

Figure 4:
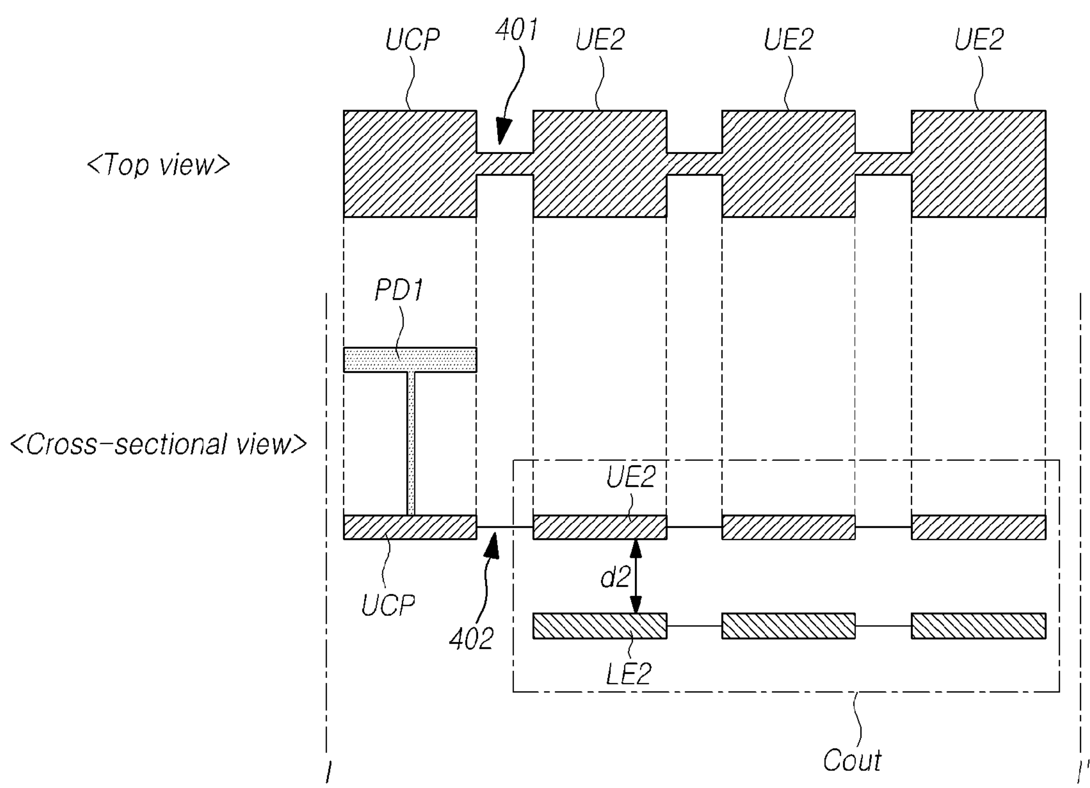
FIG. 4 is a diagram illustrating another example of the cross-sectional structure, taken along the line I-I' of FIG. 1, of the second area in the memory illustrated in FIG. 1.
Figure 5:
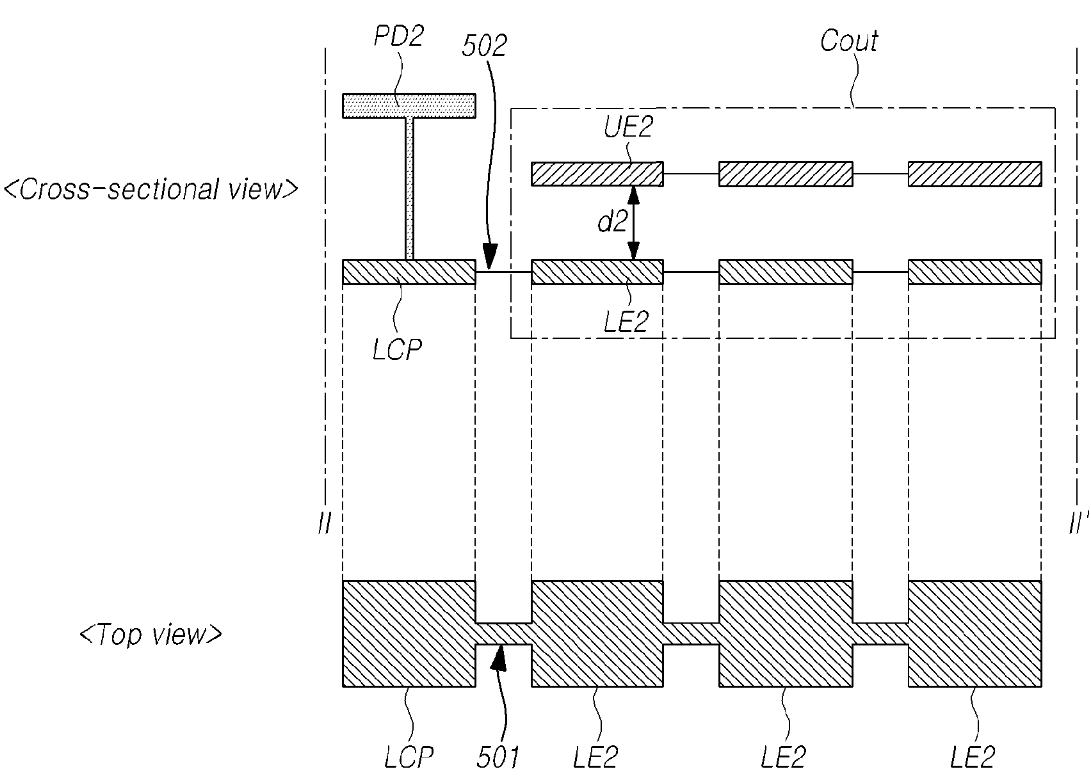
FIG. 5 is a diagram illustrating another example of the cross-sectional structure, taken along the line II-II' of FIG. 1, of the second area in the memory illustrated in FIG. 1.

FIG. 4 is a diagram illustrating another example of the cross-sectional structure, taken along the line I-I' of FIG. 1, of the second area A2 in the memory 100 illustrated in FIG. 1. FIG. 5 is a diagram illustrating another example of the cross-sectional structure, taken along the line II-II' of FIG. 1, of the second area A2 in the memory 100 illustrated in FIG. 1.

Referring to FIGS. 4 and 5, the external capacitors Cout may be disposed in the second area A2 of the memory 100.

Each of the external capacitors Cout may include a second upper electrode UE2 and a second lower electrode LE2.

Second upper electrodes UE2 may be electrically connected to each other through a pattern formed using the third metal layer M3 positioned at a layer where the second upper electrodes UE2 are disposed, as indicated by 401 and 402.

Although a portion indicated by 402 is illustrated as a line shape to facilitate distinction between the second upper electrodes UE2 and a connecting portion, the thickness of the portion indicated by 402 may be the same as or similar to the thickness of the second upper electrode UE2. The width of the portion connecting the second upper electrodes UE2 may be smaller than the width of the second upper electrodes UE2 like the portion indicated by 401.

Second lower electrodes LE2 may be electrically connected to each other through a pattern formed using the second metal layer M2 positioned at a layer where the second lower electrodes LE2 are disposed, as indicated by 501 and 502.

Although a portion indicated by 502 is illustrated as a line shape to facilitate distinction between the second lower electrodes LE2 and a connecting portion, the thickness of the portion indicated by 502 may be the same as or similar to the thickness of the second lower electrode LE2. The width of the portion connecting the second lower electrodes LE2 may be smaller than the width of the second lower electrodes LE2 like the portion indicated by 501.

Since the connection between the second upper electrodes UE2 or the connection between the second lower electrodes LE2 is realized using a metal layer used to form the second upper electrodes UE2 or a metal layer used to form the second lower electrodes LE2, the electrical connection structure between the external capacitors Cout may be provided without disposing an additional metal layer.

The second upper electrodes UE2 may be electrically connected to the first pad electrode PD1 through an upper connection pattern UCP which is positioned at a layer where the second upper electrodes UE2 are disposed. The second lower electrodes LE2 may be electrically connected to the second pad electrode PD2 through a lower connection pattern LCP which is positioned at a layer where the second lower electrodes LE2 are disposed.

Since the electrical connection between the external capacitors Cout and pad electrodes is realized using metal layers positioned at layers where the second upper electrodes UE2 and the second lower electrodes LE2 are disposed, the connection between the external capacitors Cout and the pad electrodes may be easily realized without the addition of a metal layer.

In the examples illustrated in FIGS. 4 and 5, since the second pad electrode PD2 is electrically connected to the second lower electrodes LE2 through the lower connection pattern LCP, the second pad electrode PD2 may be positioned not to overlap with the external capacitor Cout.

As illustrated in the example in FIG. 4, the first pad electrode PD1 may be positioned not to overlap with the external capacitor Cout but to overlap with the upper connection pattern UCP. However, the first pad electrode PD1 may be positioned to overlap with the external capacitor Cout.

In this case, the second lower electrode LE2 may be positioned below the upper connection pattern UCP. The upper connection pattern UCP may be regarded as the second upper electrode UE2. Since the external capacitor Cout may be further disposed in an area overlapping with the first pad electrode PD1, an overall capacitance by the external capacitors Cout may be increased.

Since the external capacitors Cout are positioned between the plurality of memory cells disposed in the first area A1 and the logic circuit disposed in the second area A2, interconnections which connect the plurality of memory cells and the logic circuit may be disposed while passing through an area where the external capacitors Cout are disposed.

Figure 6:
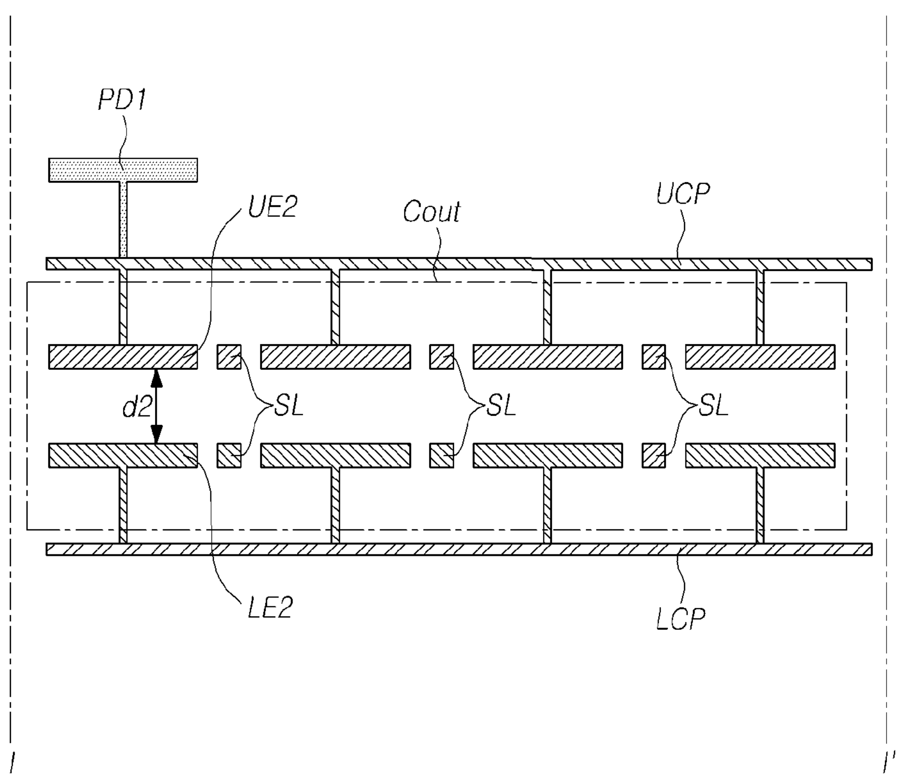
FIGS. 6 and 7 are diagrams illustrating examples of structures in which signal lines are disposed in the structures illustrated in FIGS. 2 and 4, respectively.
Figure 7:
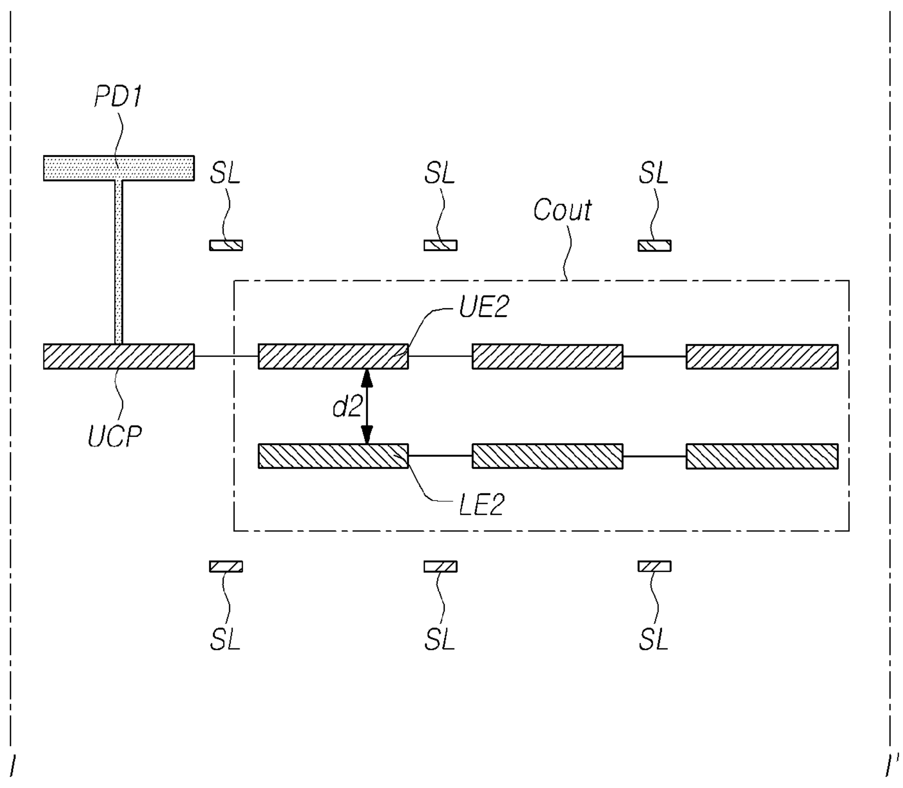

FIGS. 6 and 7 are diagrams illustrating examples of structures in which signal lines SL are disposed in the structures illustrated in FIGS. 2 and 4, respectively.

Referring to FIG. 6, a structure in which signal lines SL connecting the plurality of memory cells and the logic circuit are disposed in the structure illustrated in FIG. 2 is illustrated as an example. Since FIG. 6 illustrates the cross-section taken along the line I-I' of FIG. 1, FIG. 6 illustrates an example of the cross-sectional structure of the signal lines SL which pass through the area where the external capacitors Cout are disposed.

The signal lines SL may be interconnections which connect the plurality of memory cells and the logic circuit, and may be, for example, word lines, bit lines, lines supplying power to memory cells or the like.

The signal lines SL may be positioned between areas where the external capacitors Cout are disposed. The signal lines SL may be positioned in an area between two adjacent external capacitors Cout among the external capacitors Cout.

The signal lines SL may be disposed using at least one of metal layers constituting the external capacitors Cout.

For example, a signal line SL may be positioned between the second upper electrodes UE2 included in the external capacitors Cout. The signal line SL may be disposed using the third metal layer M3 in the same manner as the second upper electrodes UE2. The signal line SL may be disposed by being insulated from the second upper electrodes UE2.

A signal line SL may be positioned between the second lower electrodes LE2 included in the external capacitors Cout. The signal line SL may be disposed using the second metal layer M2 in the same manner as the second lower electrodes LE2. The signal line SL may be disposed by being insulated from the second lower electrodes LE2.

Since the signal line SL is positioned at a layer where the second upper electrodes UE2 or the second lower electrodes LE2 are disposed, the signal line SL may be disposed without adding a separate metal layer.

Since the second upper electrodes UE2 and the second lower electrodes LE2 are electrically connected by the upper connection pattern UCP and the lower connection pattern LCP positioned at different layers, the electrical connection structure between the external capacitors Cout may be provided even when the signal lines SL pass through the area where the external capacitors Cout are disposed.

For another example, the connection between the second upper electrodes UE2 may be realized using a metal layer disposed at the same layer as the second upper electrodes UE2, or the connection between the second lower electrodes LE2 may be realized using a metal layer disposed at the same layer as the second lower electrodes UE2. In this case, the signal lines SL may be disposed using metal layers which are positioned at layers different from a layer where the second upper electrodes UE2 or the second lower electrodes LE2 are disposed.

Referring to FIG. 7, a structure in which signal lines SL connecting the plurality of memory cells and the logic circuit are disposed in the structure illustrated in FIG. 4 is illustrated as an example. Since FIG. 7 illustrates the cross-section taken along the line I-I' of FIG. 1, FIG. 7 illustrates an example of the cross-sectional structure of the signal lines SL which pass through the area where the external capacitors Cout are disposed.

The second upper electrodes UE2 may be electrically connected to each other using the third metal layer M3 positioned at a layer where the second upper electrodes UE2 are disposed. In this case, the signal lines SL may be disposed using the fourth metal layer M4 positioned between a layer where the second upper electrodes UE2 are disposed and a layer where the first pad electrode PD1 is disposed.

The second lower electrodes LE2 may be electrically connected to each other using the second metal layer M2 positioned at a layer where the second lower electrodes LE2 are disposed. In this case, the signal lines SL may be disposed using the first metal layer M1 positioned below a layer where the second lower electrodes LE2 are disposed.

As in the example illustrated in FIG. 7, the signal lines SL may be positioned in an area between the external capacitors Cout. The signal lines SL may be disposed not to overlap with the second upper electrodes UE2 and the second lower electrodes LE2.

Alternatively, the signal lines SL may be disposed to overlap with portions of the second upper electrodes UE2 and the second lower electrodes LE2.

In the case where the number of the signal lines SL is large or the second upper electrode UE2 and the second lower electrode LE2 are disposed to be wider than the first upper electrode UE1 and the first lower electrode LE1 of the cell capacitor Ccell, the signal line SL made of the first metal layer M1 or the fourth metal layer M4 may be disposed to pass through an area overlapping with the external capacitor Cout.

Since the structure in which the external capacitors Cout may be disposed in a partial area of the second area A2 and the signal lines SL connecting the plurality of memory cells and the logic circuit may be disposed is provided, the external capacitors Cout may be disposed while not affecting the operation of the memory 100.

A capacitor formed by at least a part of the external capacitors Cout may be provided as a component of a circuit positioned outside the memory 100. The external capacitors Cout may be electrically connected to an external circuit through pad electrodes, and a structure in which the external capacitors Cout are electrically connected to the external circuit may be various.

Figure 8:
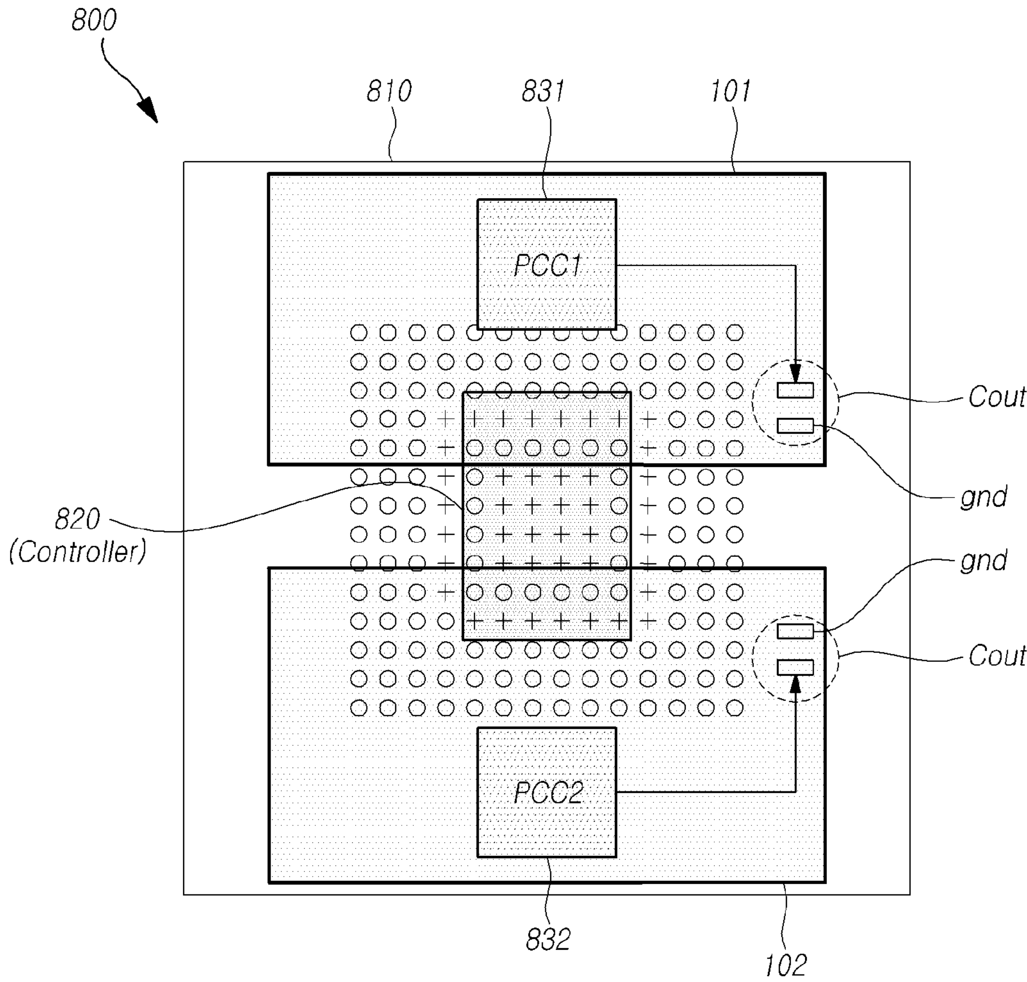
FIGS. 8 to 10 are diagrams illustrating examples of structures of a semiconductor package including the memory according to an embodiment of the present disclosure.
Figure 9:
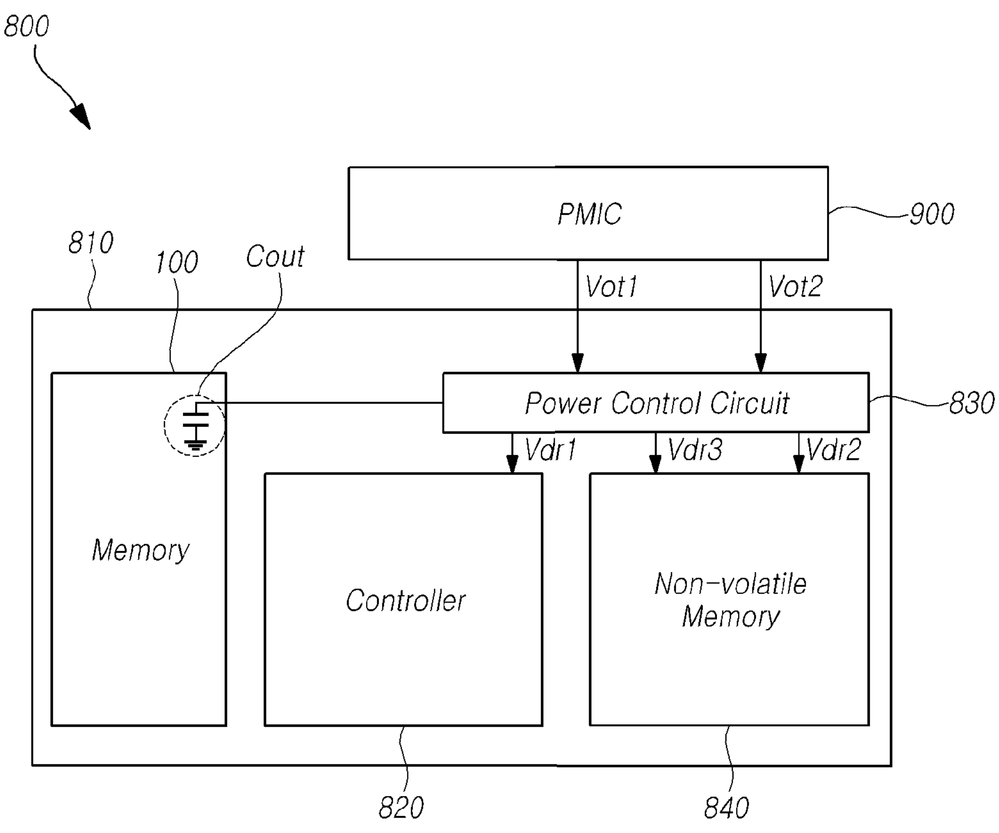
Figure 10:
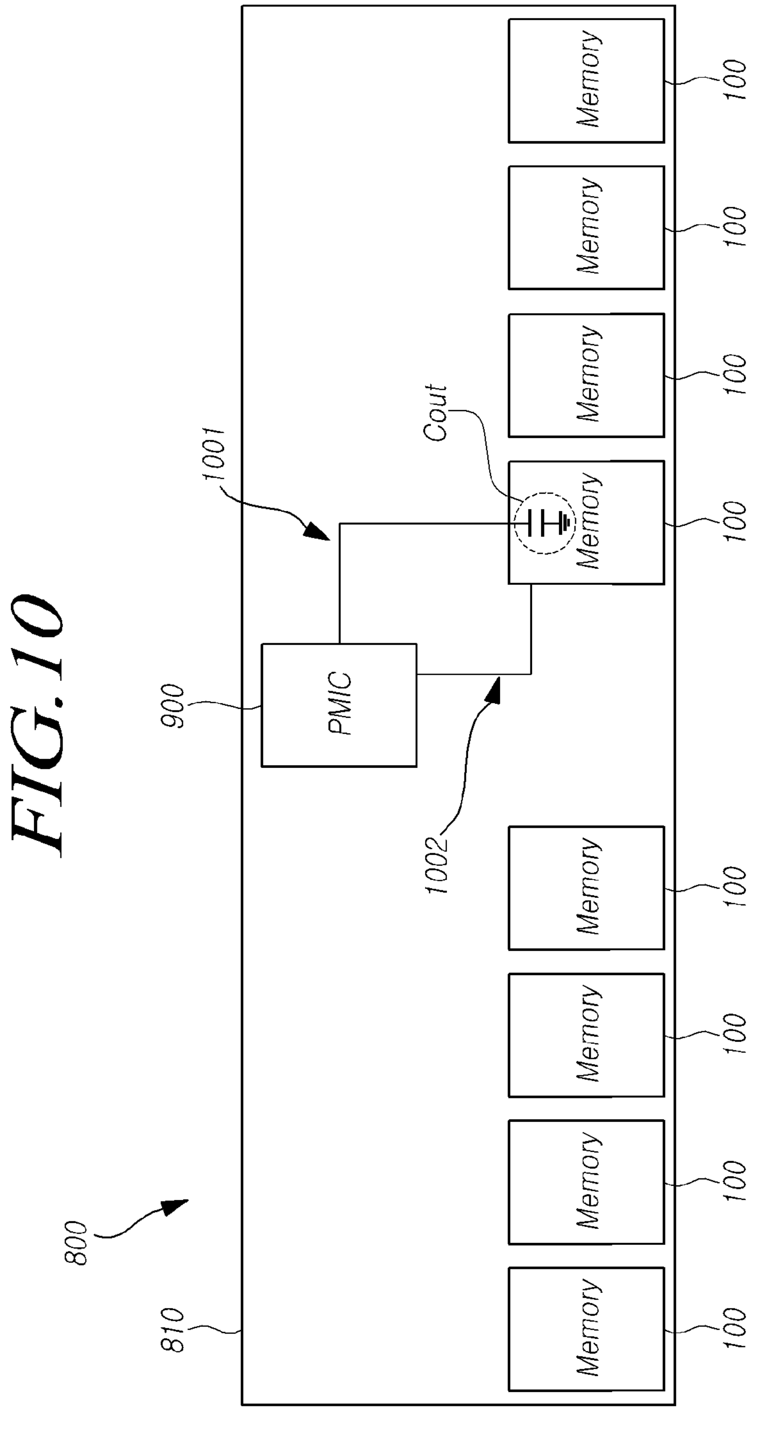

FIGS. 8 to 10 are diagrams illustrating examples of structures of a semiconductor package 800 including the memory 100 according to the embodiment of the present disclosure.

Referring to FIG. 8, the semiconductor package 800 may include a first memory 101 and a second memory 102 which are positioned on a substrate 810. The first memory 101 and the second memory 102 may be, for example, volatile memories.

The substrate 810 may be, for example, a printed circuit board (PCB). Besides the first memory 101 and the second memory 102, another type of memory may be further disposed on the substrate 810.

A controller 820 may be disposed on the substrate 810. The controller 820 may control, for example, the operation of a memory which is included in the semiconductor package 800 and has a type other than the first memory 101 and the second memory 102.

A first power control circuit (PCC1) 831 and a second power control circuit (PCC2) 832 may be disposed on the substrate 810. The first power control circuit 831 and the second power control circuit 832 may be positioned, for example, at a layer where the controller 820 is disposed on the substrate 810.

The first memory 101 and the second memory 102 may be disposed over the controller 820, the first power control circuit 831 and the second power control circuit 832. Positions at which a circuit configuration including the controller 820 and so forth and a memory 100 are disposed may be various.

At least one of the first memory 101 and the second memory 102 may include at least two external capacitors Cout which are positioned outside an area where a plurality of memory cells are disposed. At least a part of the external capacitors Cout may be electrically connected to each other. The external capacitors Cout may be provided to the outside in the form of one capacitor.

External capacitors Cout disposed in the first memory 101 and the second memory 102 may be disposed in a state in which they are insulated from circuit elements positioned inside the first memory 101 and the second memory 102.

The external capacitors Cout may be electrically connected to circuit components which are positioned outside the first memory 101 and the second memory 102.

For example, the external capacitors Cout included in the first memory 101 may be electrically connected to the first power control circuit 831. The external capacitors Cout included in the second memory 102 may be electrically connected to the second power control circuit 832.

The first power control circuit 831 and the second power control circuit 832 may be, for example, circuits which supply voltages required for driving the memory 100, the memory of a type other than the memory 100 and the controller 820.

Alternatively, the first power control circuit 831 and the second power control circuit 832 may be circuits which regulate the level of a voltage supplied from the outside and supply regulated voltages to the above-described memory 100 or circuits. The first power control circuit 831 and the second power control circuit 832 may regulate the levels of voltages of the same type or the levels of voltages of different types.

For example, the first power control circuit 831 may regulate the level of a voltage used to drive the memory 100 or the controller 820. The second power control circuit 832 may regulate the level of a voltage used to generate signals transmitted and received by the memory 100 or the controller 820.

Since capacitances required by the first power control circuit 831 and the second power control circuit 832 are provided by the external capacitors Cout positioned inside the first memory 101 and the second memory 102, the structure of the semiconductor package 800 may not be complicated by the disposition of capacitors. The structure of the semiconductor package 800 may be easily implemented. The external capacitors Cout may be electrically connected to the first power control circuit 831 or the second power control circuit 832 through the aforementioned pad electrodes. Further, the external capacitors Cout may be electrically connected to an external circuit while one end thereof are grounded ('gnd').

As such, since the external capacitors Cout included in the first memory 101 or the second memory 102 are used for an external circuit (e.g., a solution chip/device mounted on the same printed circuit board (PCB) on which memories are mounted), the disposition of passive elements used in a power control circuit 830 positioned outside the first memory 101 and the second memory 102 may become easy.

FIG. 9 is a diagram illustrating in detail an example of the configuration of a semiconductor package 800 in which external capacitors Cout included in a memory 100 are used for an external circuit.

Referring to FIG. 9, the semiconductor package 800 may include the memory 100 including external capacitors (i.e., peripheral capacitors) Cout which are disposed in an area other than a core area where a plurality of memory cells are disposed. The memory 100 may be, for example, a volatile memory.

The semiconductor package 800 may include a non-volatile memory 840. The semiconductor package 800 may include a controller 820 which controls the operation of the non-volatile memory 840.

The semiconductor package 800 may include a power control circuit 830 which regulates the level of an external voltage supplied by a power management integrated circuit (PMIC) 900 positioned outside.

The power control circuit 830 may be, for example, a switching regulator which includes a switch. The power control circuit 830 may be, for example, a buck converter or a boost converter.

The power control circuit 830 may include a switch, and may include a circuit element such as an inductor, a capacitor and a resistor.

The power control circuit 830 may be electrically connected to external capacitors Cout which are included in the memory 100. Since the power control circuit 830 uses the external capacitors Cout which are included in the memory 100, capacitors required for the configuration of the power control circuit 830 may not be separately disposed.

The power control circuit 830 may regulate the level of an external voltage inputted from the power management integrated circuit 900 and output a regulated voltage.

For example, the power control circuit 830 may decrease the level of a first external voltage Vot1 and output a first driving voltage Vdr1. The first driving voltage Vdr1 may be provided to the controller 820. The first driving voltage Vdr1 may be used for driving the controller 820 or generation of a signal by the controller 820.

The power control circuit 830 may increase the level of a second external voltage Vot2 and output a second driving voltage Vdr2. The power control circuit 830 may decrease the level of the second external voltage Vot2 and output a third driving voltage Vdr3.

The second driving voltage Vdr2 and the third driving voltage Vdr3 may be provided to the non-volatile memory 840. For example, the second driving voltage Vdr2 may be used as a voltage for driving a memory cell included in the non-volatile memory 840. The third driving voltage Vdr3 may be used to generate a signal for operating the non-volatile memory 840, but the embodiment of the present disclosure is not limited thereto.

As such, since the power control circuit 830 which supplies a regulated voltage to the controller 820 or the non-volatile memory 840 may be implemented using the external capacitors Cout included in the memory 100, the disposition of the power control circuit 830 including a switch in the semiconductor package 800 may be facilitated.

Since a voltage whose level is regulated by the switching regulator is supplied to the controller 820 or the non-volatile memory 840, the efficiency of a voltage for driving the controller 820 or the like may be improved.

Further, the external capacitors Cout included in the memory 100 may be used for a circuit which supplies a voltage or a signal to the memory 100.

Depending on the type of the semiconductor package 800, capacitors included in the power management integrated circuit 900 may be implemented by the external capacitors Cout of the memory 100.

Referring to FIG. 10, a semiconductor package 800 may include a plurality of memories 100 which are disposed on a substrate 810. At least a part of the plurality of memories 100 may include external capacitors Cout which are positioned outside an area where a plurality of memory cells are disposed.

As described in the above examples, as the external capacitors (i.e., peripheral capacitors) Cout, at least two external capacitors Cout may be electrically connected to each other and be used for an external circuit. The external capacitors Cout may be electrically connected to a circuit positioned outside the memory 100 through pad electrodes.

The external capacitors (i.e., peripheral capacitors) Cout may be electrically connected to, for example, a power management integrated circuit (PMIC) 900 which is positioned on the substrate 810 and is disposed outside the memory 100.

A capacitor needed for the power management integrated circuit 900 may be provided by the external capacitors Cout which are included in the memory 100.

A capacitor for the power management integrated circuit 900 may not be separately disposed on the substrate 810.

At least a part among the external capacitors Cout included in the memory 100 may be electrically connected depending on a capacitance required by an external circuit. According to the connection structure of the external capacitors Cout, a capacitor which provides a capacitance required by the aforementioned power control circuit 830 or power management integrated circuit 900 may be implemented.

When the external capacitors Cout of the memory 100 are provided as a circuit which supplies a voltage to the corresponding memory 100, the external capacitors Cout may be electrically connected to an external circuit through interconnections different from a voltage supply path. For example, the external capacitors Cout of the memory 100 may be electrically connected to the power management integrated circuit 900 by a portion indicated by '1001' in FIG. 10. The power management integrated circuit 900 may supply a voltage to the memory 100 through a portion indicated by '1002'.

Unlike the above-described example, in various types of semiconductor packages 800 such as a DIMM, a CXL, an SSD and an uMCP each including the memory 100, a structure in which the external capacitors of the memory 100 are used as the capacitor of an internal circuit of the semiconductor package 800 may be provided.

As is apparent from the above description, according to an embodiment of the present disclosure, since the external capacitors Cout are disposed using an area other than an area where a plurality of memory cells are disposed in the memory 100, the external capacitors Cout may be provided without degradation in the performance of the memory 100. Since the external capacitors Cout are implemented as silicon capacitors like the cell capacitors Ccell disposed in the plurality of memory cells, the external capacitors Cout may be easily implemented without adding a separate process.

The external capacitors Cout implemented in the memory 100 may be provided as a capacitor which is used in a circuit positioned outside the memory 100.

Without separately disposing a capacitor used for the corresponding circuit, a layout structure of the semiconductor package 800 including the memory 100 and various circuits may be easily implemented.

Although various embodiments of the present disclosure have been described with particular specifics and varying details for illustrative purposes, those skilled in the art will appreciate that various modifications, additions and substitutions may be made based on what is disclosed or illustrated in the present disclosure without departing from the spirit and scope of the present disclosure as defined in the following claims. Furthermore, the embodiments may be combined to form additional embodiments.

What is claimed is:

1. A semiconductor package comprising:

a memory including a first area in which a plurality of memory cells are disposed and a second area which is positioned outside the first area, wherein the memory includes cell capacitors disposed in the first area, and at least two peripheral capacitors disposed in the second area, each of the at least two peripheral capacitors includes a second upper electrode and a second lower electrode;

a power control circuit positioned outside the memory, and configured to supply a voltage to the at least two peripheral capacitors;

a first pad electrode electrically connected to the second upper electrode included in at least one of the at least two peripheral capacitors, and exposed to an outside; and a second pad electrode electrically connected to the second lower electrode included in at least one of the at least two peripheral capacitors, and exposed to the outside.

2. The semiconductor package according to claim 1, wherein:

each of the cell capacitors includes a first upper electrode and a first lower electrode; and at least one of the second upper electrode and the second lower electrode is disposed at the same layer as a layer where at least one of the first upper electrode and the first lower electrode is disposed.

3. The semiconductor package according to claim 2, wherein the second upper electrode is disposed at the same layer as a layer where the first upper electrode is disposed, and the second lower electrode is disposed at the same layer as a layer where the first lower electrode is disposed.

4. The semiconductor package according to claim 2, wherein a distance between the second upper electrode and the second lower electrode is the same as a distance between the first upper electrode and the first lower electrode.

5. The semiconductor package according to claim 2, wherein an area of the second upper electrode is the same as or larger than an area of the first upper electrode, and an area of the second lower electrode is the same as or larger than an area of the first lower electrode.

6. The semiconductor package according to claim 2, wherein second upper electrodes included in the at least two peripheral capacitors, respectively, are electrically connected to each other, and second lower electrodes included in the at least two peripheral capacitors, respectively, are electrically connected to each other.

7. The semiconductor package according to claim 1, wherein the first pad electrode and the second pad electrode are electrically connected to the power control circuit.

8. The semiconductor package according to claim 1, wherein the first pad electrode overlaps with one of the at least two peripheral capacitors, and the second pad electrode does not overlap with the at least two peripheral capacitors.

9. The semiconductor package according to claim 1, wherein:

the first pad electrode is electrically connected to the second upper electrode through an upper connection pattern which is positioned between a layer where the first pad electrode is disposed and a layer where the second upper electrode is disposed; and the second pad electrode is electrically connected to the second lower electrode through a lower connection pattern, and the second lower electrode is positioned between a layer where the second pad electrode is disposed and a layer where the lower connection pattern is disposed.

10. The semiconductor package according to claim 1, wherein:

the first pad electrode is electrically connected to the second upper electrode through an upper connection pattern which is disposed at the same layer as a layer where the second upper electrode is disposed; and the second pad electrode is electrically connected to the second lower electrode through a lower connection pattern which is disposed at the same layer as a layer where the second lower electrode is disposed.

11. The semiconductor package according to claim 1, wherein the at least two peripheral capacitors are positioned in an area between the plurality of memory cells disposed in the first area and a logic circuit disposed in the second area.

12. The semiconductor package according to claim 1, wherein the memory further includes a signal line disposed between two adjacent peripheral capacitors among the at least two peripheral capacitors, and connecting at least one of the plurality of memory cells disposed in the first area and a logic circuit disposed in the second area.

13. The semiconductor package according to claim 1, wherein the at least two peripheral capacitors are insulated from circuit elements which are disposed in the first area and the second area.

14. A memory comprising:

a plurality of first capacitors included in a plurality of memory cells, and disposed in a first area;

a plurality of second capacitors positioned in a second area positioned outside the first area, and electrically connected to each other, each of the plurality of second capacitors includes a second upper electrode and a second lower electrode;

a first pad electrode electrically connected to the second upper electrode, and exposed to an outside; and a second pad electrode electrically connected to the second lower electrode, and exposed to the outside.

15. The memory according to claim 14, wherein:

second upper electrodes included in the plurality of second capacitors are electrically connected to each other, and second lower electrodes included in the plurality of second capacitors are electrically connected to each other.

16. The memory according to claim 15, wherein the first pad electrode and the second pad electrode are electrically connected to a circuit which supplies a voltage from the outside, through a line other than a line through which the voltage is supplied.

17. A semiconductor package comprising:

a printed circuit board (PCB);

a memory mounted on the PCB; and a solution device mounted on the PCB, wherein the memory includes cell capacitors disposed in a core area and peripheral capacitors disposed in a peripheral circuit area, and wherein the peripheral capacitors are configured to be used for the solution device, wherein the peripheral capacitors and the cell capacitors are implemented as silicon capacitors formed through a single process.

* * * * *